(12) United States Patent
Hashimoto

(10) Patent No.: US 8,263,874 B2
(45) Date of Patent: Sep. 11, 2012

(54) MULTILAYER CIRCUIT BOARD

(75) Inventor: Toshihiro Hashimoto, Kagoshima (JP)

(73) Assignee: KYOCERA Corporation, Kyoto (JP)

( * ) Notice: Subject to any disclaimer, the term of this patent is extended or adjusted under 35 U.S.C. 154(b) by 229 days.

(21) Appl. No.: 12/842,499

(22) Filed: Jul. 23, 2010

(65) Prior Publication Data

US 2011/0024167 A1 Feb. 3, 2011

(30) Foreign Application Priority Data

Jul. 29, 2009 (JP) .................................. 2009-176056

(51) Int. Cl.
*H01K 1/00* (2006.01)

(52) U.S. Cl. ........ 174/258; 174/250; 174/251; 174/255; 174/256

(58) Field of Classification Search .................. None
See application file for complete search history.

(56) References Cited

U.S. PATENT DOCUMENTS

| 5,373,110 | A  | * | 12/1994 | Inasaka          | 174/267   |
|-----------|----|---|---------|------------------|-----------|
| 7,650,694 | B2 | * | 1/2010  | Mobley           | 29/846    |
| 7,998,560 | B2 | * | 8/2011  | Sugimoto         | 428/210   |
| 8,040,657 | B2 | * | 10/2011 | Hasegawa et al.  | 361/301.1 |
| 8,168,288 | B2 | * | 5/2012  | Nomiya et al.    | 428/209   |
| 2008/0223606 | A1 | * | 9/2008 | Tsukizawa et al. | 174/260   |
| 2010/0147568 | A1 | * | 6/2010 | Nomiya           | 174/257   |
| 2010/0224396 | A1 | * | 9/2010 | Nomiya           | 174/258   |

FOREIGN PATENT DOCUMENTS

JP 4152693 5/1992

* cited by examiner

*Primary Examiner* — Boris Chervinsky
(74) *Attorney, Agent, or Firm* — Procopio, Cory, Hargreaves & Savitch LLP

(57) ABSTRACT

A multilayer circuit board comprising low inductance through-conductors is disclosed. The multilayer circuit board comprises first ceramic substrate means, first layered section means, and second ceramic substrate means that allow insulation layers to be substantially thin, a length of through-conductors to be substantially short, and low relative permittivity of the insulation layers compared to resin insulation layers. Thus, increases in operation frequency of the multilayer circuit board are possible.

17 Claims, 6 Drawing Sheets

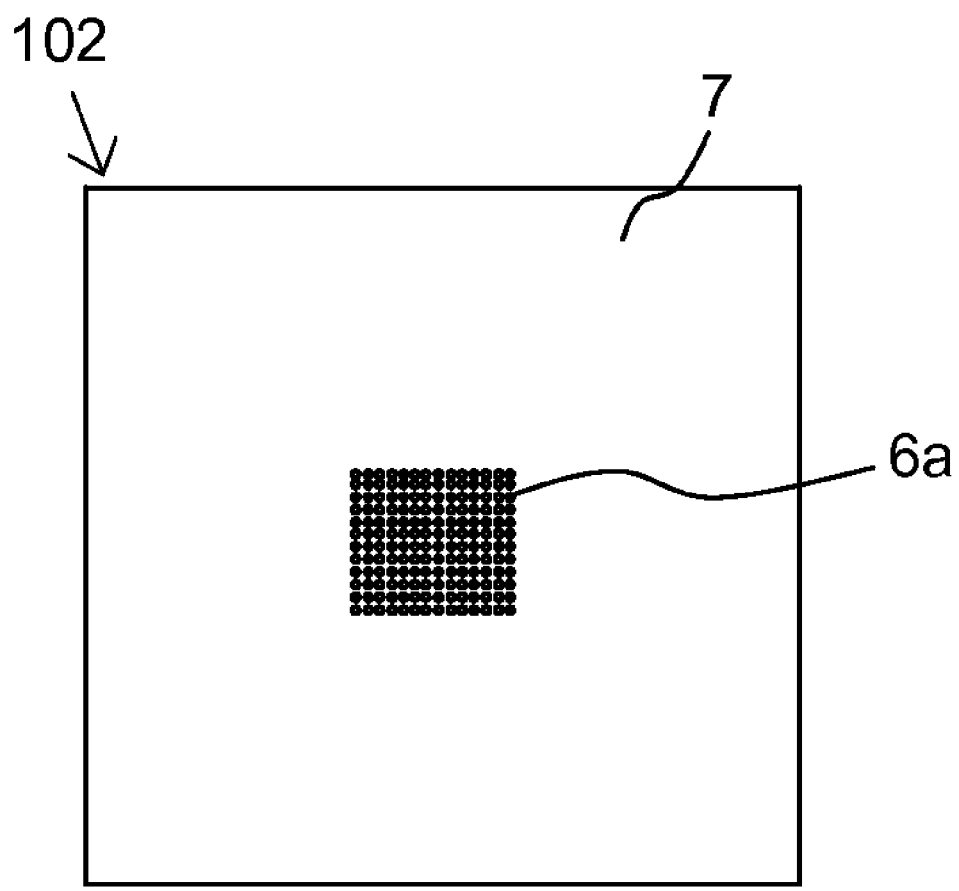

MULTILAYER CIRCUIT BOARD

CROSS-REFERENCE TO RELATED APPLICATION

The present disclosure claims priority under 35 U.S.C. §119 to Japanese Patent Application No. 2009-176056, filed on Jul. 29, 2009, entitled "MULTILAYER CIRCUIT BOARD". The content of which is incorporated by reference herein in its entirety.

FIELD OF THE INVENTION

Embodiments of the present disclosure relate generally to multilayer circuit board, and more particularly relate to thin multilayer circuit boards comprising conducting layers and insulating layers alternatively located on a substrate.

BACKGROUND

Multilayer circuit boards composed by alternately layering multiple thin-film conductive layers and multiple resin insulation layers located on an upper surface of a ceramic circuit board have been used as multilayer circuit boards. These multilayer circuit boards may comprise terminals located on an upper surface of the ceramic circuit board electrically coupled to a semiconductor device. Additionally, the multilayer circuit boards may comprise connection pads located on a lower surface of the ceramic circuit board electrically coupled to an external electrical circuit. The multilayer circuit boards can be used as probe card substrates for performing electrical checks of semiconductor devices.

SUMMARY

A multilayer circuit board comprising low inductance through-conductors is disclosed. The multilayer circuit board comprises first ceramic substrate means, first layered section, and second ceramic substrate means that allow insulation layers to be substantially thin, a length of through-conductors to be substantially short, and to have low relative permittivity of the insulation layers compared to resin insulation layers. Thus, increases in operation frequency of the multilayer circuit board are possible.

In a first embodiment, a multilayer circuit board comprises a first ceramic substrate, a first layered section located on the first ceramic substrate, and a second ceramic substrate located on the first layered section. The first ceramic substrate comprises a first ceramic layer, a plurality of first coupling pads located on the first ceramic layer, and a plurality of first through-conductors each electrically coupled to each of the first coupling pads respectively, and penetrating the first ceramic layer. The first layered section comprises a plurality of first resin insulation layers, a plurality of first conductive lines each electrically coupled to each of the first coupling pads respectively, and penetrating the plurality of first resin insulating layers. The second ceramic substrate comprises a second ceramic layer, a plurality of second coupling pads located on the second ceramic layer, and a plurality of second through-conductors each electrically coupled to each of the first conductive lines respectively, and penetrating the second ceramic layer.

In a second embodiment, a multilayer circuit board comprises first ceramic substrate means, first layered section means, and second ceramic substrate means.

In a third embodiment, a method for producing a multilayer circuit board comprises providing, first ceramic substrate means, first layered section means, and providing second ceramic substrate means.

BRIEF DESCRIPTION OF THE DRAWINGS

Embodiments of the present disclosure are hereinafter described in conjunction with the following figures, wherein like numerals denote like elements. The figures are provided for illustration and depict exemplary embodiments of the present disclosure. The figures are provided to facilitate understanding of the present disclosure without limiting the breadth, scope, scale, or applicability of the present disclosure. The drawings are not necessarily made to scale.

FIG. 2A is an illustration of an upper surface of a multilayer circuit board according to an embodiment of the present disclosure.

DETAILED DESCRIPTION

Figure 1A:
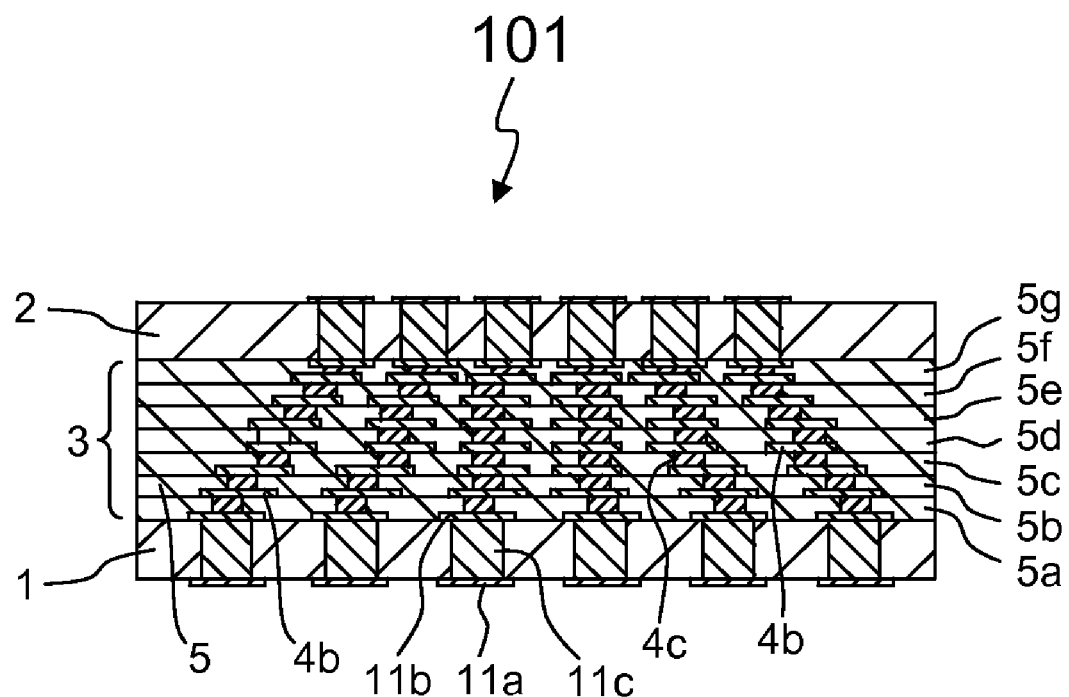
FIG. 1A is an illustration of a cross-sectional view of a multilayer circuit board according to an embodiment of the present disclosure.

The following description is presented to enable a person of ordinary skill in the art to make and use the embodiments of the disclosure. The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. Furthermore, there is no intention to be bound by any expressed or implied theory presented in the preceding field, background, summary or the following detailed description. The present disclosure should be accorded scope consistent with the claims, and not limited to the examples described and shown herein.

Embodiments of the disclosure are described herein in the context of one practical non-limiting application, namely, a multilayer circuit board. Embodiments of the disclosure, however, are not limited to such multilayer circuit boards, and the techniques described herein may also be utilized in other applications. For example, embodiments may be applicable to Micro-electromechanical system (MEMS) substrates, probe cards, and the like.

As would be apparent to one of ordinary skill in the art after reading this description, these are merely examples and the embodiments of the disclosure are not limited to operating in accordance with these examples. Other embodiments may be utilized and structural changes may be made without departing from the scope of the exemplary embodiments of the present disclosure.

A ceramic circuit board may comprise metalized wiring layers comprising metal materials, and an insulating base comprising internal conductors such as through-conductors located on a surface and inside thereof. The insulating base can be formed by layering multiple ceramic insulation layers on each other. The insulating base can comprise surface connection pads located on the upper surface thereof electrically coupled to the thin-film conductive layers, and the inner connection pads. The surface connection pads and the inner connection pads may be mutually electrically coupled via the internal conductors.

The thin-film conductive layers may be electrically coupled to the surface connection pads located on the upper surface of the insulating base, and the uppermost layer of the thin-film conductive layers may be electrically coupled to an connection pad of the semiconductor device via a probe bonded to the thin-film conductive layers. The connection pad of the semiconductor device and the external electrical device can be electrically coupled via the probe, the thin-film conductive layers, the surface connection pads, the internal conductors, and the surface connection pads. Operational verification tests of the semiconductor device can be conducted. Instead of the semiconductor device, other electrical devices or the like may be used.

Figure 1B:
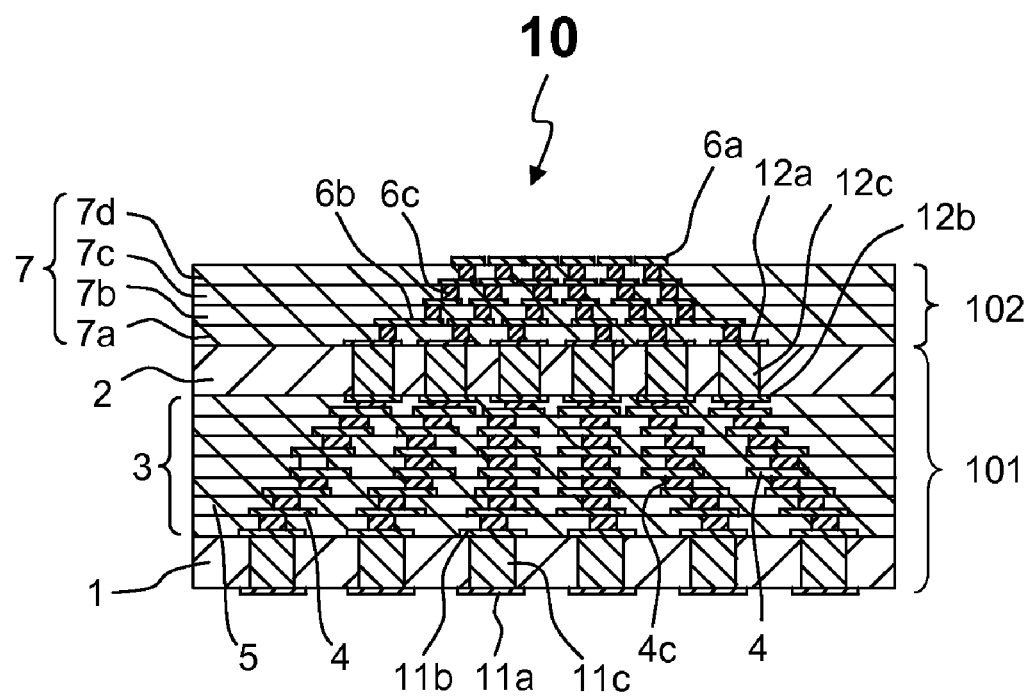
FIG. 1B is an illustration of a cross-sectional view of a multilayer circuit board according to an embodiment of the present disclosure.

FIG. 1A is an illustration of a cross-sectional view of a first multilayer circuit board 101 according to an embodiment of the present disclosure. FIG. 1B is an illustration of a cross-sectional view of the multilayer circuit board 10 according to an embodiment of the present disclosure.

The multilayer circuit board 10 comprises the first multilayer circuit board 101 and a second multilayer circuit board 102. In other words, the multilayer circuit board 10 comprises two kinds of circuit boards, the first and second multilayer circuit board 101 and 102. The second multilayer circuit board 102 is located on the first multilayer circuit board 101. Some of reference numerals shown in FIG. 1A are not shown in FIG. 1B for better understandings.

The first multilayer circuit board 101 comprises a first ceramic substrate 1, a second ceramic substrate 2, and a thin-film conductor section 3. The thin-film multilayer conductor section 3 is located between the first ceramic substrate 1 and the second ceramic substrate 2. The second multilayer circuit board 102 is formed by alternately layering thin-film conductive layers 6a-6c and resin insulation layers 7 on an upper surface of the first multilayer circuit board 101. The resin insulation layers 7 comprise four resin layers 7a to 7d in the present invention. The thin-film multilayer conductor section 3 comprises lower thin-film conductive layers 4 and lower resin insulation layers 5 (5a to 5g). The lower thin-film conductive layers 4 and the lower resin insulation layers 5 are alternately layered. In the present embodiment, the lower resin insulation layers 5 comprise seven layers 5a to 5g. However, the number of the lower resin insulation layers 5 is not limited to seven. In an embodiment, the number of the lower resin insulation layers 5 may be 2, 3, 4, 5, 6, 8 or more. In the same manner, the number of the resin insulation layer 7 is not limited to four. In an embodiment, the number of the resin insulation layers 7 may be 2, 3, 5, or more.

The first ceramic substrate 1, the second ceramic substrate 2 and the thin-film multilayer conductor section 3 may have, for example but without limitation, a quadrilateral shape, a circular shape, and the like. In a planar view (not shown) of the first multilayer ceramic substrate 101 showed in FIG. 1A, outer dimensions and shapes of each of these components are substantially identical, and they are layered to form the first multilayer circuit board 101 in a manner not generating unevenness on the outer surface. The thin-film conductive layers 6 (6a-6c) and the resin insulation layers 7 (7a-7d) of the second multilayer circuit board 102 are layered on the first multilayer circuit board 101. The second multilayer circuit board 102 may have substantially identical outer dimensions and shapes as the first multilayer circuit board 101 in the planar view, and they are layered in a manner not generating unevenness on the outer surface of the second multilayer circuit board 102.

A shape of the second multilayer circuit board 102 is substantially, for example but without limitation, rectangular, circular or the like, and the upper surface is used as a region for mounting a semiconductor device (not shown) for performing implementation or electrical checks. The implementation may comprise, for example but without limitation, implementation for electrically and mechanically connecting a semiconductor device to the second multilayer circuit board 102 for use as a semiconductor device, temporary installation for performing electrical checks of a semiconductor device, or the like. The semiconductor devices may comprise, for example but without limitation, semiconductor integrated circuit elements, such as Integrated Circuits (ICs) and Large Scale Integrated circuits (LSIs), Micro-Electro-Mechanical Systems (MEMS), and the like.

In the multilayer circuit board 10 shown in FIG. 1B, a lower surface of the first ceramic substrate 1 faces an external electrical circuit (not shown) electrically coupled to a prescribed region of a terminal or the like of the external electrical circuit. The external electrical circuit is electrically coupled to first surface connection pads 11a located on the lower surface of the multilayer circuit board 10 (or the first multilayer circuit board 101). The multilayer circuit board 10 is electrically coupled to an connection pad (not shown) of a semiconductor device electrically coupled to the thin-film conductive layers 6. Third surface connection pads 6a are exposed on an uppermost surface of the multilayer circuit board 10 (i.e. the second multilayer circuit board 102), and are coupled to the first surface connection pads 11a via a conductive path comprising the first inner connection pads 11b, first through-conductors 11c, the lower thin-film conductive layers 4 (fourth inner connection pads 4b and fourth though-conductors 4c), second surface connection pads 12a, second inner connection pads 12b, second through-conductors 12c, and the thin-film conductive layers 6 (third inner connection pads 6b and third through-conductors 6c). The semiconductor device and the external electrical circuit are electrically coupled via the second multilayer circuit board 102. In this manner, various signals are exchanged and electrical tests, or the like, of the semiconductor device can be conducted.

Because an interproximal space between connection pads of a semiconductor device is generally smaller than an interproximal space between terminals of an external electrical circuit, an interproximal space between the thin-film conductive layers 6 (i.e. the third surface connection pads 6a exposed on the uppermost surface of the multilayer circuit board 10) may be smaller than an interproximal space between the first through-conductors 11c (i.e. the first surface connection pads 11a). Therefore, an interproximal space between the second surface connection pads 12a or second through-conductors 12c may be smaller than the interproximal space between the first surface connection pads 11a or the first through-conductors 11c, respectively. In addition, in order to make the interproximal space between the thin-film conductive layers 6 smaller than the interproximal space between the first inner connection pads 11b, the interproximal space between the second inner connection pad pads 12b may be smaller than the interproximal space between the first inner connection pads 11b.

Figure 2B:
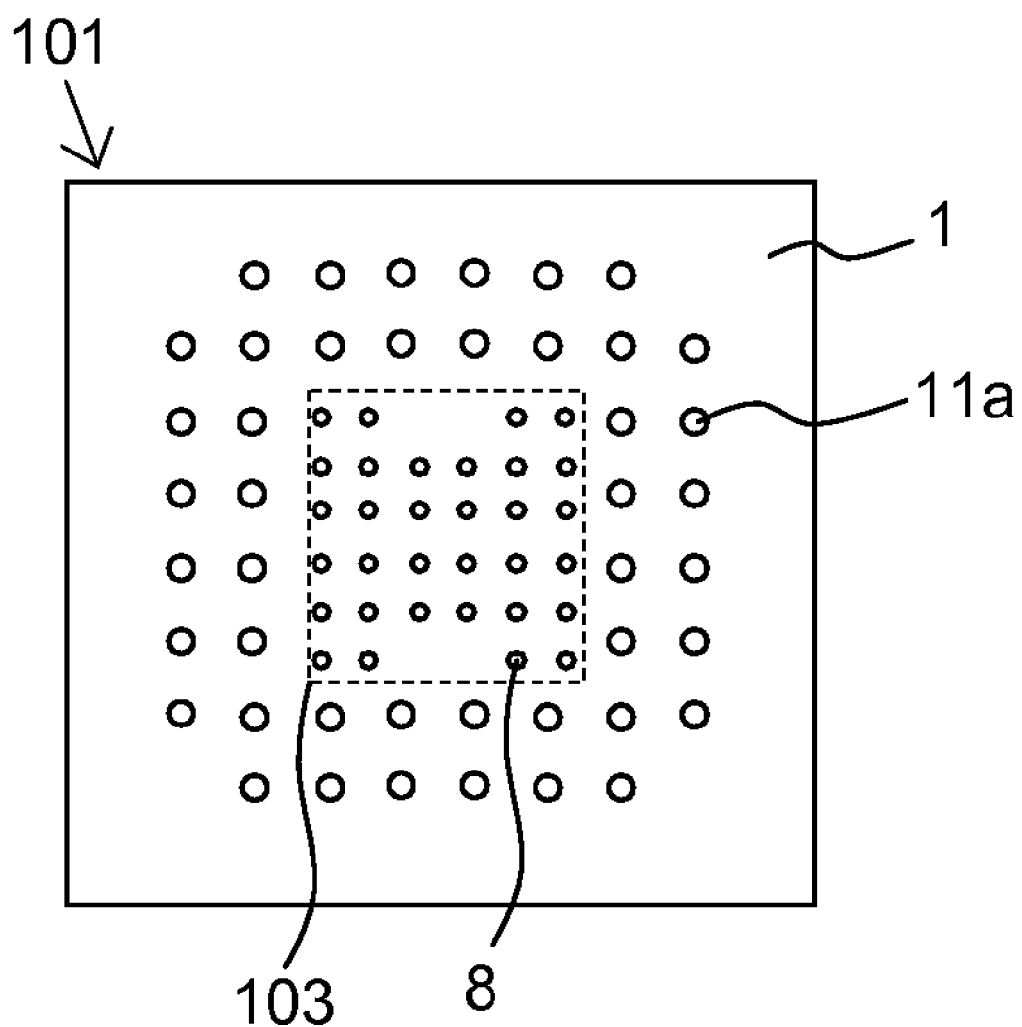
FIG. 2B is an illustration of a lower surface of a multilayer circuit board according to an embodiment of the present disclosure.
Figure 2C:
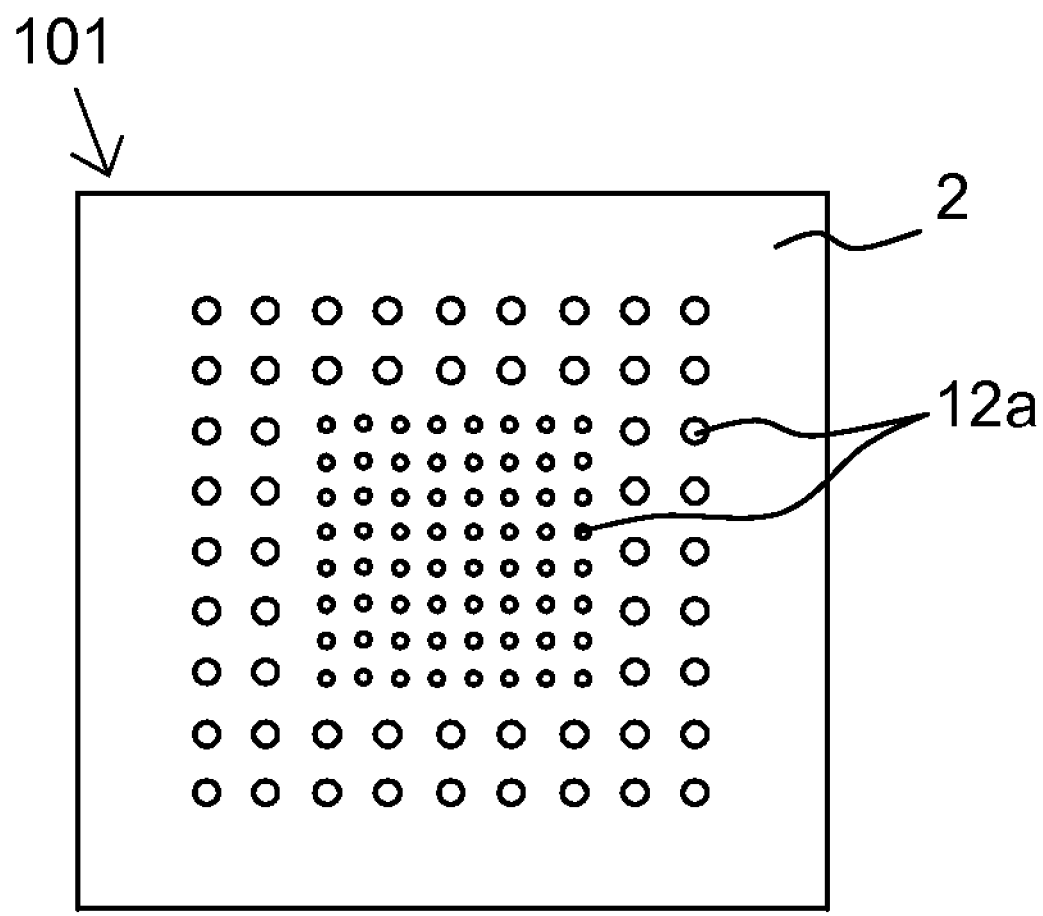
FIG. 2C is an illustration of an upper surface of a multilayer circuit board according to an embodiment of the present disclosure, showing thin-film conductive layers and resin insulation layers have been removed.

In an embodiment, the multilayer circuit board 10 may comprise auxiliary surface pads in addition to the first surface connection pads 11a. FIG. 2A is an illustration of an upper surface of a multilayer circuit board 10 (i.e. a second multilayer circuit board 102) according to an embodiment of the present disclosure. FIG. 2B is an illustration of the lower surface of the multilayer circuit board 10 shown in FIG. 2A. FIG. 2C is an illustration of the upper surface of the multilayer circuit board 10 shown in FIG. 2A without the thin-film conductive layers 6 and the resin insulation layers 7 or the upper surface of the first multilayer circuit board 101 (i.e., the upper surface of the second ceramic substrate 2).

The lower surface of the first multilayer circuit board 101 comprises a central section 103. The central section 103 comprises auxiliary surface pads 8 electrically coupled to the external electrical circuit (not shown). The auxiliary surface pads 8 may be used for connecting auxiliary electronic parts. The auxiliary electronic parts may comprise, for example but without limitation, a capacitive element such as a multilayer ceramic capacitor located on the central section 103 of the lower surface of the first multilayer circuit board 101. Alternatively, the auxiliary surface pads 8 may be used to electrically couple the external electrical circuit to the thin-film conductive layers 6 located on an uppermost layer of the multilayer circuit board 10 electrically coupled to a semiconductor device. In the embodiment shown in FIG. 2B, the auxiliary surface pads 8 are located inside the central section 103 of the lower surface of the first multilayer circuit board 101. Alternatively, the auxiliary surface pads 8 may be located on a peripheral area of the lower surface of the first multilayer circuit board 101 such as areas external to the central section 103.

The auxiliary surface pads 8 may be electrically coupled to a section of the lower thin-film conductive layers 4 (4b and 4c) via through-conductors (not shown) similar to the first through-conductors 11c, for example, and in some cases, the first through-conductors 11c for the auxiliary surface pads 8 may have a smaller interproximal space than the second through-conductors 12c.

The first multilayer circuit board 101 can be a substrate for the second circuit board 102 comprising thin-film conductive layers 6 and the resin insulation layers 7 and electrically coupled to the semiconductor device.

The first ceramic substrate 1 may comprise ceramic materials such as ceramic materials that enable machine work to be performed at a substantially similar accuracy as for metal materials (i.e., machinable ceramics). The machinable ceramics may comprise, for example but without limitation, an aluminum oxide sintered body, an aluminum nitride sintered body, a mullite sintered body, a glass ceramic sintered body, a microcrystalline sintered body of either crystallized glass in which crystal components have been deposited in a glass matrix, mica, aluminum titanate, or the like.

Embodiments where the first ceramic substrate 1 comprises an aluminum oxide sintered body may be manufactured as follows. The first ceramic substrate 1 may be manufactured by producing a slurry. The slurry may be made by adding and mixing appropriate organic binders and organic solvents to raw powder such as aluminum oxide and silicon oxide, forming the slurry into a sheet form. The sheet form is formed using sheet-forming techniques such as a doctor-blade method or lip-coater method to produce a ceramic green sheet, and then forming the ceramic green sheet into an appropriate shape and dimensions through a cutting process and punching process and firing it at a temperature of approximately 1,300-1,500° C. In this case, the first ceramic substrate 1 may be manufactured by layering multiple ceramic green sheets.

The first surface connection pads 11a and the first through-conductors 11c are regions for electrically connecting an external electrical circuit and comprise a section of a conductive path for electrically coupling the external electrical circuit with the semiconductor device. The first surface connection pads 11a are positioned on the lower surface of the first ceramic substrate 1 such as the lower surface of the multilayer circuit board 10 and are bonded with a prescribed region of the external electrical circuit via solder, metal bumps, or conductive connection materials such as conductive adhesive agents. Alternatively, the first surface connection pads 11a are electrically coupled to the external electrical circuit by being temporarily pressed against the prescribed region of the external electrical circuit without being bonded. The lower thin-film conductive layers 4 of the thin-film multilayer conductor section 3 are electrically coupled to the external electrical circuit via the first through-conductors 11c. A lower end surface of first through-conductors 11c is connected to the first surface connection pads 11a.

The first surface connection pads 11a and the first through-conductors 11c may comprise metal materials such as but without limitation, tungsten, molybdenum, manganese, copper, silver, palladium, gold, platinum, or the like. The first through-conductors 11c, when composed of tungsten, for example, can be formed by producing a metal paste. The metal paste can be made by mixing and kneading organic solvents and binders with tungsten powder, forming through-holes on a ceramic green sheet acting as the first ceramic substrate 1 using a method such as a mechanical punching process, and then filling the paste into the interior of the through-holes using a method such as a screen printing method. The first surface connection pads 11a can be formed on the lower surface of the ceramic green sheet. In one embodiment, the first surface connection pads 11a can be formed by printing and adhering identical metal paste to the end faces of the metal paste that forms the first through-conductors 11c and is exposed from the lower ends of the through-holes. Alternatively, the first surface connection pads 11a can be formed by adhering metal materials, such as but without limitation, titanium, copper, tungsten, or the like, using a sputtering method or an evaporation method.

First inner connection pads 11b are formed on the upper surface of the first ceramic substrate 1 and are adhered to upper end surfaces of the first through-conductors 11c. The first inner connection pads 11b allow electrical connections between the first through-conductors 11c and the lower thin-film conductive layers 4 to be implemented more easily and reliably. In one embodiment, the first inner connection pads 11b are formed over a sufficiently wide area. In this manner, it is easy to make positional alignment with the upper end surfaces of the first through-conductors 11c, and the first through-conductors 11c and the lower thin-film conductive layers 4 can be easily electrically coupled via the first inner connection pads 11b.

The first inner connection pads 11b may be formed in advance on the upper surface of the first ceramic substrate 1 using metal materials, such as tungsten, in a similar manner as the first surface connection pads 11a. Alternatively, a layer with a pattern with a large area may be provided as the lowermost layer of the lower thin-film conductive layers 4 as described below and used as the first inner connection pads 11b. In this manner, it is easy to make connections between the other lower thin-film conductive layers 4 and the upper end surfaces of the first through-conductors 11c.

The lower thin-film conductive layers 4 are electrically coupled to the first through-conductors 11c and electrically couple the first through-conductors 11c to the second through-conductors 12c and the surface inner connection pads 12a of the second ceramic substrate 2. The lower resin insulation layers 5 (5a-5g in FIGS. 1-2) electrically insulate the lower thin-film conductive layers 4 from one another. The through-conductors also known as via conductors (not shown) passing through the lower resin insulation layers 5 in a thickness direction (not shown) provide electrical coupling between top and bottom lower thin-film conductive layers 4. In order to make the interproximal space between the thin-film conductive layers 6 (6a-6c) exposed on the uppermost surface of the multilayer circuit board 10 smaller than the interproximal space between the first through-conductors 11c or the first surface connection pads 11a as described above, the via conductors are formed in a manner in which the interproximal space is smaller in the upper layers of the multilayer circuit board 10 compared to the lower layers of the multilayer circuit board 10. However depending on a number and/or positions of the via conductors, there may be parts of the multilayer circuit board 10 in which identical interproximal spaces are used in the top and the bottom layers of the multilayer circuit board 10.

The lower resin insulation layers 5 are formed using resin materials, such as but without limitation, polyimide resin, polyamide-imide resin, polyetherimide resin, liquid crystal polymer, or the like.

The lower thin-film conductive layers 4 and the via conductors are made of metal materials, such as but without limitation, copper, silver, palladium, gold, platinum, aluminum, chrome, nickel, cobalt, titanium, tungsten, molybdenum, manganese, alloy materials thereof, or the like.

The thin-film multilayer conductor section 3 comprising the lower thin-film conductive layers 4 and lower resin insulation layers 5 can be layered on top of the first ceramic substrate 1 using the following exemplary method.

First, a thin-film conductor is adhered with a wide area (not shown) on the upper surface of the first ceramic substrate 1 using, for example but without limitation, a sputtering method, an evaporation method, a plating method, or the like. The thin-film conductor is then processed into a prescribed pattern using an etching method to form the lower thin-film conductive layer 4 of the lowermost layer of the exposed first ceramic substrate 1. The lower thin-film conductive layer 4 of the lowermost layer of the first ceramic substrate 1 may be used as the first inner connection pads 11b as described above. Next, a paste of an unhardened resin material, such as a hermosetting polyimide resin, or the like, is applied to form the lower resin insulation layers 5. The lower resin insulation layers 5 are formed on the lower thin-film conductive layer 4 (e.g., the first inner connection pads 11b) of the lowermost layer of the exposed first ceramic substrate 1 and the upper surface of the exposed first ceramic substrate 1. After the paste is applied, hardening of the paste is performed. Alternatively, instead of applying a paste, an unhardened resin material may be layered in sheet form. Next, while performing masking of the lower resin insulation layers 5 using a prescribed pattern and performing an etching process to provide through-holes at prescribed positions, the above metal materials are filled into the through-holes using a plating method or the like to form the via conductors. By hardening the unhardened resin material such as a paste, a sheet, or the like after alternately layering the lower thin-film conductive layers 4 and the lower resin insulation layers 5, the thin-film multilayer conductor section 3 can be layered on the upper surface of the first ceramic substrate 1.

The second ceramic substrate 2 secures mechanical strength such as rigidity of the base substance for layering the thin-film conductive layers 6 and the resin insulation layers 7 without generating defects such as deformations. The second ceramic substrate 2 can be produced with a similar method using similar materials as the first ceramic substrate 1.

The second surface connection pads 12a, the second inner connection pads 12b and the second through-conductors electrically couple the lower thin-film conductive layers 4 and the thin-film conductive layers 6. The second surface connection pads 12a, the second inner connection pads 12b and the second through-conductors comprise part of the conductive path for electrically coupling the external electrical circuit and the semiconductor device. The second surface connection pads 12a are located on the upper surface of the second ceramic substrate 2 (i.e., the upper surface of the first multilayer circuit board 101) and may be coupled to the thin-film conductive layers 6. The second surface connection pads 12a are electrically coupled to the lower thin-film conductive layers 4 of the thin-film multilayer conductor section 3 via the second through-conductors 12c of which the upper end surfaces is adhered to the second surface connection pads 12a.

The second surface connection pads 12a, the second inner connection pads 12b and the second through-conductors 12c can be formed with a similar method using similar metal materials as the first surface connection pads 11a, the inner connection pads 11b and the first through-conductors 11c. Specifically, The second surface connection pads 12a, the second inner connection pads 12b and the second through-conductors comprise metal materials, such as but without limitation, tungsten, molybdenum, manganese, copper, silver, palladium, gold, platinum, or the like. The second surface connection pads 12a, the second inner connection pads 12b and the second through-conductors are formed with methods, such as but without limitation, printing metal paste, firing, adhering metal materials using a sputtering method or an evaporation method, or the like.

The second ceramic substrate 2 may comprise a second inner connection pads 12b thereon, as the first ceramic substrate 1 comprises the first inner connection pads 11b thereon. The second inner connection pads 12b are located on the lower surface of the second ceramic substrate 2, and adhered to the lower end surfaces of the second through-conductors 12c. The second inner connection 12b can allow the second through-conductors 12c couple electrically to the lower thin-film conductive layers 4 more easily and reliably.

As with the first inner connection pads 11b, the second inner connection pads 12b may also be formed in advance on the lower surface of the second ceramic substrate 2 with a similar method using similar materials as the second surface connection pad pads 12a, and among the lower thin-film conductive layers 4, the area may be wider than the other lower thin-film conductive layers 4.

An interproximal space of the second through-conductors 12c or an interproximal space of the second surface connection pads 12a may be smaller than that of the first through-conductors 11c or that of the first surface connection pads 11a, respectively, to make the interproximal space between the third through-conductors 6c located at the uppermost surface or the interproximal space between the third surface connection pads 6a smaller than the interproximal space of the first through-conductors 11c or the inner connection pads 11b, respectively. However, due to a position and/or a number of terminals, or the like, of the coupled external electrical circuit, or the respective dimensions and shapes of the first ceramic substrate 1 and the second ceramic substrate 2, there may be parts in which the interproximal space between the second through-conductors 12c (or between the second surface connection pads 12a) is similar to the interproximal space between the first through-conductors 11c (or between the first surface connection pads 11a).

Similarly, an interproximal space between the second inner connection pads 12b may be smaller than an interproximal space between the first inner connection pads 11b. However, due to a position and/or a number of terminals, or the like, of the coupled external electrical circuit, or the respective dimensions and shapes of the first ceramic substrate 1 and the second ceramic substrate 2, there may be parts in which the interproximal space between the second inner connection pads 12b is similar to the interproximal space between the first inner connection pads 11b.

As shown in FIG. 2C, the second surface connection pads 12a may each have different sizes. In the embodiment shown in FIG. 2C, in the peripheral part of the upper surface of the second ceramic substrate 2, where it is relatively easy to secure space for arranging the second surface connection pads 12a, the second surface connection pads 12a are made larger than in the central part.

The first through-conductors 11c and the second through-conductors 12c may not necessarily be formed in the same number, and as shown in FIG. 2, there are cases in which the number of second through-conductors 12c or second surface connection pads 12a is greater than the number of first through-conductors 11c or first surface connection pads 11a, respectively, or vice versa. When the first through-conductors 11c and the second through-conductors 12c, are arranged in this manner, it is possible to, for example, appropriately select and use several of the multiple second through-conductors 12c according to the number or positions of connection pads of the semiconductor device electrically coupled to the second multilayer circuit board 102. In this case, the through-conductors 12c of the second ceramic substrate 2 can be formed into one type of arrangement and used for multiple types of semiconductor devices with different numbers and positions of connection pads, thus providing advantages in terms of cost.

The second multilayer circuit board 102 is provided above the first multilayer circuit board 101. The second multilayer circuit board 102 comprises thin-film conductive layers 6 and resin insulation layers 7. The thin-film conductive layers 6 and the resin insulation layers 7 are alternately layered. The thin-film conductive layers 6 comprise third surface connection pads 6a provided on the surface thereof, third inner connection pads 6b provided on the surface of each resin insulation layer 7 (7a-7d), and third through-conductors 6c that pass through each resin insulation layer 7.

In the second multilayer circuit board 102, the thin-film multilayer conductor section 3 is arranged between two ceramic substrates such as the first ceramic substrate 1 and the second ceramic substrate 2 that each comprise through-conductors (first through-conductors 11c and second through-conductors 12c), and the thin-film multilayer conductor section 3 can be made to perform similar functions as the ceramic insulation layers and the internal conductors (not shown) used in a conventional ceramic circuit board. Compared to conventional ceramic insulation layers and internal conductors (metalized wiring layers, etc.), the lower thin-film conductive layers 4 and the lower resin insulation layers 5 forming the thin-film multilayer conductor section 3 can be reduced to approximately half the thickness. For this reason, the second multilayer circuit board 102, and the first multilayer circuit board 101 acting as the base substance can be made thin in an effective manner compared to a ceramic circuit board used in a conventional multilayer circuit board, thus making it easy to make a profile of the multilayer circuit board 10 thin. The lower resin insulation layers 5 have a low relative permittivity compared to ceramic insulation layers composed of aluminum oxide sintered bodies or the like. The thickness of the lower resin insulation layers 5 is also low (length of through-conductors is short), and this is useful for reducing inductance. Therefore, the second multilayer circuit board 102 allows the profile of the multilayer circuit board 10 to be made thin, thereby providing low inductance in the multilayer circuit board 10.

The thin-film conductive layers 6 layered on the upper surface of the first multilayer circuit board 101 are electrically coupled to the second surface connection pads 12a and electrically couples the second surface connection pads 12a to the semiconductor device. The resin insulation layers 7 electrically insulate the thin-film conductive layers 6 from one another. The via conductors passing through the resin insulation layers 7 in a thickness direction (not shown) provide electrical connections between top and bottom thin-film conductive layers 6. In order to make the interproximal space between the thin-film conductive layers 6 exposed on the uppermost surface smaller than the interproximal space between the first through-conductors 11c or the first surface connection pads 11a as described above. The via conductors are formed in a manner in which the interproximal space is smaller in the upper layers of the multilayer circuit board 10 compared to the lower layers of the multilayer circuit board 10. However, depending on the number or positions of the via conductors, there may be parts in which identical interproximal spaces are used in top and bottom layers of the multilayer circuit board 10.

The resin insulation layers 7 are formed from similar materials as the lower resin insulation layers 5, for example. The thin-film conductive layers 6 are formed from similar materials as the lower thin-film conductive layers 4, for example.

The resin insulation layers 7 and the thin-film conductive layers 6 may be layered on the upper surface of the first multilayer circuit board 101 using, for example, a similar method as that used for layering the thin-film multilayer conductor section 3 located on the upper surface of the first ceramic substrate 1 as described above.

A paste of an unhardened resin material can be applied to form the resin insulation layers 7 (of the lowermost layer) on the upper surface of the first multilayer circuit board 101 (second ceramic substrate 2 and electrode pads 12b), and then hardening is performed. Alternatively, instead of applying a paste, an unhardened resin material may be layered in sheet form. Next, while performing a masking and etching process of a prescribed pattern on the resin insulation layers 7, through-holes are provided at parts corresponding to the second surface connection pads 12a, and metal materials forming the via conductors are filled into the through-holes using a plating method or the like. Next, after adhering the thin-film conductors (not shown) over a wide area using for example but without limitation, a sputtering method, an evaporation method, a plating method, or the like, the thin-film conductors are processed into a prescribed pattern using an etching method to form the thin-film conductive layers 6. By hardening and alternately layering the resin insulation layers 7 and the thin-film conductive layers 6, the thin-film conductive layers 6 and the resin insulation layers 7 can be layered on the upper surface of the first multilayer circuit board 101.

When forming the second surface connection pads 12a with a method such as adhering metal materials using a sputtering method or an evaporation method as described above, the second surface connection pads 12a may be formed during the process of layering the thin-film conductive layers 6 and the resin insulation layers 7 on the first multilayer circuit board 101. Specifically, on the upper surface of the second ceramic substrate 2, on which the second surface connection pads 12a have not been formed, the second surface connection pads 12a may be formed so as to adhere to the upper ends of the second through-conductors 12c using similar metal materials and methods as the thin-film conductive layers 6, after which the process of layering the resin insulation layers 7 and the thin-film conductive layers 6 is performed.

Regarding the second multilayer circuit board 102 so produced, a probe (not shown) for performing electrical tests of semiconductor device connection pads or semiconductor devices can be coupled to the thin-film conductors layers 6 exposed on the uppermost surface of the second multilayer circuit board 102 (FIG. 2A). For example, and the first inner connection pads 11b of the lower surface can be coupled to a prescribed region of the external electrical circuit, such as a circuit board terminal. The semiconductor device and the external electrical circuit can be electrically coupled via the second multilayer circuit board 102, and signal transmissions and electrical checks of semiconductor devices are performed. Electrical checks of semiconductor devices comprise, for example but without limitation, tests to determine whether an integrated circuit of a semiconductor integrated circuit element is operating properly, and the like. The second multilayer circuit board 102 can be used as a probe card.

In one embodiment, the third inner connection pads 6 b are thicker than the lower thin-film conductive layers 4. In this manner, electrical resistivity in the thin-film conductive layers 6 can be controlled more accurately. The thin-film conductive layers 6 comprise a plurality of parts with narrow widths in order to be formed with a high density. That is, the thin-film conductive layers 6, has a high density compared to the lower thin-film conductive layers 4. By making the thin-film conductive layers 6 relatively thick, it is possible to suppress decreases in cross-sectional area in a direction perpendicular to a direction of flow of electric current, thereby increases in the electrical resistivity are controlled.

To make the thin-film conductive layers 6 restively thick, the thickness of the thin-film conductive layers 6 is increased proportionally to a narrowing of the width compared to the lower thin-film conductive layers 4. The thickness of the thin-film conductive layers 6 is increased so that the cross-sectional areas of the thin-film conductive layers 6 and the lower thin-film conductive layers 4 are substantially identical.

For example, when widths of the lower thin-film conductive layers 4 and the thin-film conductive layers 6 are about 20 μm and about 10 μm respectively, if the thickness of the lower thin-film conductive layers 4 is about 3 μm, the thickness of the thin-film conductive layers 6 should be set to about 6 μm.

The resin insulation layers 7 may be thicker than the thin-film conductive layers 6. If the thickness of the resin insulation layers 7 is insufficient, the following performance of the resin material (paste or sheet) between the thin-film conductive layers 6 may decrease, and gaps may be generated between top and bottom resin insulation layers 7. In this case, the thermal load generated in the process of mounting the second multilayer circuit board 102 may cause occurrence of swelling to be more likely in the resin insulation layers 7 or the like on the surface. For example, if the thickness of the thin-film conductive layers 6 is about 6 μm and the interproximal space between the thin-film conductive layers 6 is about 20 μm, the thickness of the resin insulation layers 7 is preferably about 10 μm or more.

Figure 3:
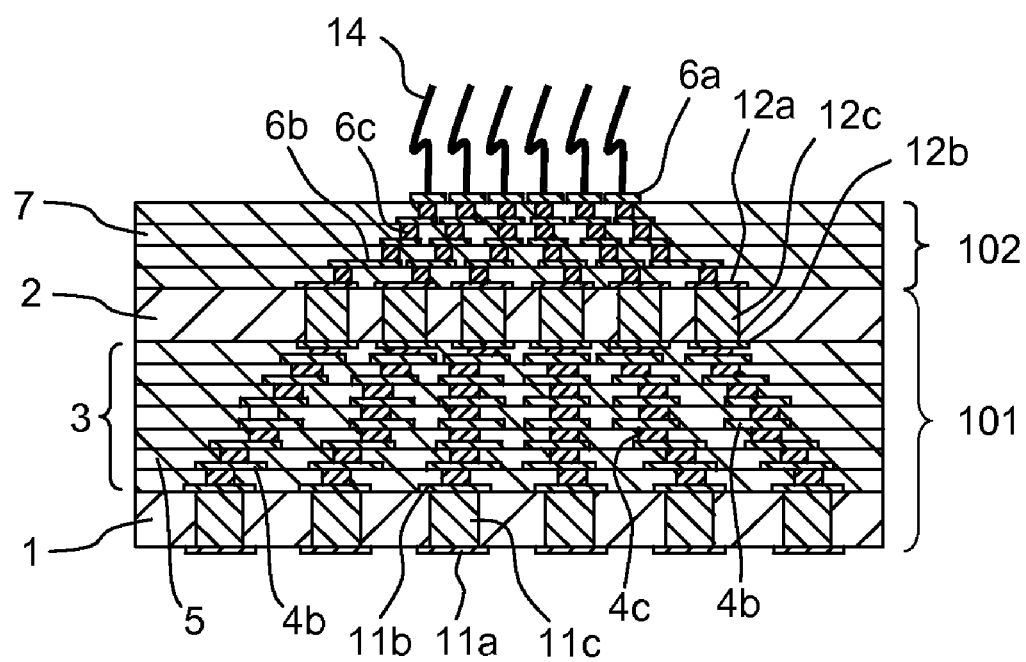
FIG. 3 is an illustration of a cross-sectional view of a probe card according to an embodiment of the present disclosure.

FIG. 3 is an illustration of a cross-sectional view of a probe card according to an embodiment of the present disclosure. With the exception of providing terminals 14 on top of the thin-film conductive layers 6 of the multilayer circuit board 10 which is substantially identical to FIG. 1. The terminals 14 are coupled to each terminal of a semiconductor device. Each of the terminals 14 is electrically coupled to each first surface connection pad 11a as mentioned above and is capable of inputting and outputting signals from the first surface connection pads 11a.

Japanese Unexamined Patent Application Publication No. 2010-54323 may be referred to find how to use a probe card, specifically to measure electrical characteristics of a semiconductor element formed on a silicon wafer.

EXAMPLES

The multilayer circuit board shown in FIG. 1B was produced as follows. Terminals coupled to the multilayer circuit board electrically couple circuit boards arranged on the upper surface of a resin insulating substrate in an about 50×about 50 matrix with an interproximal space of about 1 mm, with semiconductor integrated circuit elements with connection pads arranged on the lower surface of a silicon substrate. The connection pads are arranged in an about 50×about 50 arrangement with an interproximal space of about 0.2 mm. The multilayer circuit board of the present disclosure was produced along with a comparative example of an existing multilayer circuit board and receptive similar parameters of each circuit board were measured and compared. The parameters comprised the respective thicknesses and levels of inductance between the circuit board and the semiconductor device.

In one embodiment, the multilayer circuit board was produced by alternately layering multiple thin-film conductive layers and multiple resin insulation layers located on an upper surface of a circuit board comprising a composition described below. In contrast, the existing multilayer circuit board was produced with a conventional composition.

In both the multilayer circuit board of the present disclosure and the existing multilayer circuit board, the thin-film conductive layers and the resin insulation layers comprised the same compositions. Specifically, the thin-film conductive layers were composed of copper and had a thickness of approximately 10 μm, while the resin insulation layers comprised polyimide and had a thickness of approximately 25 μm. There were three thin-film conductive layers and four resin insulation layers.

The circuit board used for the multilayer circuit board of the of the present disclosure was formed by sequentially layering, on a first ceramic substrate comprising an aluminum oxide sintered body with a thickness of about 1 mm, lower thin-film conductive layers (9 layers) comprising copper with a thickness of about 5 μm, lower resin insulation layers (10 layers) comprising polyimide with a thickness of approximately 25 μm, and a second ceramic substrate comprising an aluminum oxide sintered body with a thickness of approximately 1 mm. The first and second through-conductors were formed with metalized conductors composed of tungsten, while the surface connection pads and inner connection pads were formed with copper evaporated layers.

The ceramic circuit board used for the existing multilayer circuit board of the comparative example was produced by layering 19 ceramic insulation layers each comprising an aluminum oxide sintered body with a thickness of approximately 0.2 mm. Metalized wiring layers comprising tungsten were formed between the ceramic insulation layers.

For both the multilayer circuit board of the present disclosure and the existing multilayer circuit board of the, first, thickness of the multilayer circuit board was measured using a dial gauge. The results show, the thickness of the multilayer circuit board of the present disclosure was about 2.35 mm while the thickness of the existing multilayer circuit board was about 3.90 mm. In the existing multilayer circuit board, the thickness of the ceramic circuit board was approximately 3.80 mm while the total thickness of the resin insulation layers and thin-film conductive layers was approximately 0.1 mm. In comparison, in the multilayer circuit board of the present disclosure, the thickness of the circuit board was approximately 2.25 mm, while the total thickness of the resin insulation layers and the thin-film conductive layers 6 was approximately 0.1 mm.

Next, in order to detect the inductance between the circuit board and the semiconductor device for both the multilayer circuit board of the present disclosure and the existing multilayer circuit board, the inductance between the connection pads and the thin-film conductive layers of the uppermost layer was measured.

The inductance was measured using an LCR meter. The results showed that while the inductance in the multilayer circuit board of the present embodiment was about 1.40 pH, the inductance in the multilayer circuit board of the comparative example was 3.49 pH.

While at least one exemplary embodiment has been presented in the foregoing detailed description, the present disclosure is not limited to the above-described embodiment or embodiments. Variations may be apparent to those skilled in the art. In carrying out the present disclosure, various modifications, combinations, sub-combinations and alterations may occur in regard to the elements of the above-described embodiment insofar as they are within the technical scope of the present disclosure or the equivalents thereof. The exemplary embodiment or exemplary embodiments are examples, and are not intended to limit the scope, applicability, or configuration of the disclosure in any way. Rather, the foregoing detailed description will provide those skilled in the art with a template for implementing the exemplary embodiment or exemplary embodiments. It should be understood that various changes can be made in the function and arrangement of elements without departing from the scope of the disclosure as set forth in the appended claims and the legal equivalents thereof. Furthermore, although embodiments of the present disclosure have been described with reference to the accompanying drawings, it is to be noted that changes and modifications may be apparent to those skilled in the art. Such changes and modifications are to be understood as being comprised within the scope of the present disclosure as defined by the claims.

The above description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although FIGS. 1-3 depict example arrangements of elements, additional intervening elements, devices, features, or components may be present in an embodiment of the disclosure.

Terms and phrases used in this document, and variations hereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent. The term "about" when referring to a numerical value or range is intended to encompass values resulting from experimental error that can occur when taking measurements.

The invention claimed is:

1. A multilayer circuit board comprising:
 a first ceramic substrate comprising:
  a first ceramic layer;
  a plurality of first coupling pads located on the first ceramic layer; and
  a plurality of first through-conductors each electrically coupled to each of the first coupling pads respectively and penetrating the first ceramic layer;
 a first layered section located on the first ceramic substrate comprising:
  a plurality of first resin insulation layers; and
  a plurality of first conductive lines each electrically coupled to each of the first coupling pads respectively and penetrating the plurality of first resin insulating layers; and
 a second ceramic substrate located on the first layered section, comprising:
  a second ceramic layer;
  a plurality of second coupling pads located on the second ceramic layer; and
  a plurality of second through-conductors each electrically coupled to each of the first conductive lines respectively and penetrating the second ceramic layer.

2. The multilayer circuit board of claim 1, wherein the second ceramic substrate further comprises a plurality of third coupling pads, each coupled to each of the second through-conductors respectively.

3. The multilayer circuit board of claim 2, further comprising a second layered section located on the second ceramic substrate, comprising:
 a plurality of second resin insulation layers; and
 a plurality of second conductive lines each electrically coupled to the third coupling pads respectively and penetrating the plurality of second resin insulating layers.

4. The multilayer circuit board of claim 3, wherein:
- each of the first resin insulation layers comprises a plurality of fourth coupling pads, each electrically coupled to each of the first conductive lines respectively; and
- each of the second resin insulation layers comprises a plurality of fifth coupling pads, each electrically coupled to each of the second conductive lines respectively.

5. The multilayer circuit board of claim 4, wherein a thickness of each of the fourth coupling pads is greater than a thickness of the fifth coupling pads.

6. A multilayer circuit board comprising: first ceramic substrate means including a first ceramic layer; a plurality of first coupling pads located on the first ceramic layer; and a plurality of first through-conductors each electrically coupled to each of the first coupling pads respectively and penetrating the first ceramic layer; first layered section means located on the first ceramic substrate and including a plurality of first resin insulation layers; and a plurality of first conductive lines each electrically coupled to the first coupling pads respectively and penetrating the plurality of first resin insulating layers; and second ceramic substrate means.

7. The multilayer circuit board of claim 6, wherein the second ceramic substrate means is located on the first layered section means, and comprises: a second ceramic layer; a plurality of second coupling pads located on the second ceramic layer; and a plurality of second through-conductors each electrically coupled to each of the first conductive lines respectively and penetrating the second ceramic layer.

8. The multilayer circuit board of claim 7, wherein the second ceramic substrate further comprises a plurality of third coupling pads, each coupled to each of the second through-conductors respectively.

9. The multilayer circuit board of claim 8, further comprising a second layered section located on the second ceramic substrate and comprising:
- a plurality of second resin insulation layers; and
- a plurality of second conductive lines each electrically coupled to the third coupling pads respectively and penetrating the plurality of second resin insulating layers.

10. The multilayer circuit board of claim 9, wherein:
- each of the first resin insulation layers comprises a plurality of fourth coupling pads, each electrically coupled to each of the first conductive lines respectively; and
- each of the second resin insulation layers comprises a plurality of fifth coupling pads, each electrically coupled to each of the second conductive lines respectively.

11. The multilayer circuit board of claim 10, wherein a thickness of the fourth coupling pads is greater than a thickness of the fifth coupling pads.

12. A method for producing a multilayer circuit board comprising: providing first ceramic substrate means including a first ceramic layer; a plurality of first coupling pads located on the first ceramic layer; and a plurality of first through-conductors each electrically coupled to each of the first coupling pads respectively and penetrating the first ceramic layer; providing first layered section means located on the first ceramic substrate means and including a plurality of first resin insulation layers; and a plurality of first conductive lines each electrically coupled to the first coupling pads respectively and penetrating the plurality of first resin insulating layers; and providing second ceramic substrate means located on the first layered section means.

13. The method of claim 12, wherein the second ceramic substrate means comprises: a second ceramic layer; a plurality of second coupling pads located on the second ceramic layer; and a plurality of second through-conductors each electrically coupled to each of the first conductive lines respectively and penetrating the second ceramic layer.

14. The method of claim 13, wherein the second ceramic substrate further comprises a plurality of third coupling pads, each coupled to each of the second through-conductors respectively.

15. The method of claim 14, further comprising a second layered section located on the second ceramic substrate and comprising:
- a plurality of second resin insulation layers; and
- a plurality of second conductive lines each electrically coupled to the third coupling pads respectively and penetrating the plurality of second resin insulating layers.

16. The method of claim 15, wherein:
- each of the first resin insulation layers comprises a plurality of fourth coupling pads, each electrically coupling to each of the first conductive lines respectively; and
- each of the second resin insulation layers comprises a plurality of fifth coupling pads, each electrically coupling to each of the second conductive lines respectively.

17. The method of claim 14, wherein a thickness of the fourth coupling pads is greater than a thickness of the fifth coupling pads.

* * * * *